(12) United States Patent
Reeder et al.

(10) Patent No.: US 6,856,134 B1
(45) Date of Patent: Feb. 15, 2005

(54) MAGNETIC RESONANCE IMAGING WITH FAT-WATER SIGNAL SEPARATION

(75) Inventors: Scott B. Reeder, Menlo Park, CA (US); Norbert J. Pelc, Los Altos, CA (US)

(73) Assignee: The Board of Trustees of The Leland Stanford Junior University, Palo Alto, CA (US)

(*) Notice: Subject to any disclaimer, the term of this patent is extended or adjusted under 35 U.S.C. 154(b) by 0 days.

(21) Appl. No.: 10/445,180

(22) Filed: May 23, 2003

(51) Int. Cl.$^7$ ................................................ G01V 3/00
(52) U.S. Cl. ..................................................... 324/309
(58) Field of Search ........................ 324/300, 307–310, 324/312, 317

(56) References Cited

U.S. PATENT DOCUMENTS

| | | | | |
|---|---|---|---|---|
| 4,983,918 A | * | 1/1991 | Nakabayashi | 324/309 |
| 5,150,053 A | * | 9/1992 | Pauly et al. | 324/309 |
| 5,229,717 A | * | 7/1993 | Hinks | 324/309 |
| 5,274,331 A | * | 12/1993 | Macovski | 324/309 |
| 5,751,145 A | * | 5/1998 | Shimizu | 324/309 |
| 5,909,119 A | * | 6/1999 | Zhang et al. | 324/309 |
| 6,025,716 A | * | 2/2000 | Deimling | 324/309 |
| 6,307,368 B1 | * | 10/2001 | Vasanawala et al. | 324/309 |
| 6,459,922 B1 | * | 10/2002 | Zhang | 600/410 |
| 6,586,933 B1 | * | 7/2003 | Hardy et al. | 324/307 |
| 6,658,280 B1 | * | 12/2003 | Haacke | 600/410 |
| 6,703,835 B2 | * | 3/2004 | Patch et al. | 324/307 |
| 6,714,807 B2 | * | 3/2004 | Zur | 600/410 |

OTHER PUBLICATIONS

Reeder et al., "Rapid MR Imaging of Articular Cartliage with Steady–State Free Precession and Multipoint Fat–Water Separation," 2003, *American Journal of Radiology*, vol. 180, pp. 357–362.

Reeder et al., "Rapid Cartilage Imaging with SSFP and Four–Point Dixon Techniques", 2002, *ISMRM*, Poster/Abstract.

Dixon, "Simple Proton Spectroscopic Imaging", 1984, *Radiology*, vol. 153, pp. 189–194.

Glover, "Multipoint Dixon Technique for Water and Fat Proton and Susceptibility Imaging", 1991, *Journal of Magnetic Resonance Imaging*, vol. 1, pp. 521–530

Rybicki et al., "Fast Three–Point Dixon MR Imaging Using Low–Resolution Images for Phase Correction: A Comparison with Chemical Shift Selective Fat Suppression for Pediatric Musculoskeletal Imaging", 2001, *American Journal of Radiology*, vol. 177, pp. 1019–1023.

Bredella et al., "Three–Point Dixon Chemical–Shift Imaging for Evaluating Articular Cartilage Defects in the Knee Joint on a Low–Field–Strength Open Magnet", 2001, *American Journal of Radiology*, vol. 177, 1371–1375.

Xiang et al., "Water–Fat Imaging with Direct Phase Encoding", 1997, *Journal of Magnetic Resonance Imaging*, vol. 7, pp. 1002–1015.

* cited by examiner

*Primary Examiner*—Diego Gutierrez
*Assistant Examiner*—Dixomara Vargas
(74) *Attorney, Agent, or Firm*—Beyer Weaver & Thomas LLP

(57) ABSTRACT

A generalized multi-point fat-water separation process is combined with steady-state free precession (SSFP) to obtain high quality images of articular cartilage with reduced imaging time.

18 Claims, 4 Drawing Sheets

MAGNETIC RESONANCE IMAGING WITH FAT-WATER SIGNAL SEPARATION

STATEMENT AS TO RIGHTS TO INVENTIONS MADE UNDER FEDERALLY SPONSORED RESEARCH OR DEVELOPMENT

The U.S. Government has rights in the disclosed invention pursuant to NIH Grant No. P41 RR 09784 to Stanford University.

BACKGROUND OF THE INVENTION

This invention relates generally to magnetic resonance imaging (MRI), and more particularly the invention relates to MRI with fat-water separation.

Magnetic resonance imaging (MRI) requires placing an object to be imaged in a static magnetic field, exciting nuclear spins in the object within the magnetic field, and then detecting signals emitted by the excited spins as they precess within the magnetic field. Through the use of magnetic gradient and phase encoding of the excited magnetization, detected signals can be spatially localized in three dimensions.

FIG. 5A is a perspective view partially in section illustrating conventional coil apparatus in an NMR imaging system, and FIGS. 5B–5D illustrate field gradients which can be produced in the apparatus of FIG. 5A. This apparatus is discussed by Hinshaw and Lent in "*An Introduction to NMR Imaging: From the Block Equation to the Imaging Equation,*" Proceedings of the IEEE, Vol. 71, No. 3, March 1983, pp. 338–350. Briefly, the uniform static field $B_0$ is generated by the magnet comprising the coil pair 10. A gradient field $G(x)$ is generated by a complex gradient coil set which can be wound on the cylinder 12. An RF field $B_1$ is generated by a saddle coil 14. A patient undergoing imaging would be positioned within the saddle coil 14.

In FIG. 5B an X gradient field is shown which is parallel to the static field $B_0$ and varies linearly with distance along the X axis but ideally does not vary with distance along the Y or Z axes. FIGS. 5C and 5D are similar representations of the Y gradient and Z gradient fields, respectively.

FIG. 6 is a functional block diagram of conventional imaging apparatus. A computer 20 is programmed to control the operation of the NMR apparatus and process FID signals detected therefrom. The gradient field is energized by a gradient amplifier 22, and the RF coils 26 for impressing an RF magnetic moment at the Larmor frequency are controlled by the transmitter 24. After the selected nuclei have been flipped, the RF coil 26 is employed to detect the FID signal which is passed to the receiver 28 and thence through digitizer 30 for processing by computer 20.

Imaging and diagnosis of articular cartilage abnormalities have become increasingly important in the setting of an aging population where osteoarthritis is second only to cardiovascular disease as a cause of chronic disability. Accurate assessment of articular cartilage is also essential with the advent of surgical and pharmacological therapies that require advanced imaging techniques for initial diagnosis and management of disease progression.

Ideal imaging of articular cartilage requires high resolution and good contrast with adjacent tissues; this can be markedly improved with fat suppression techniques. In addition, bright appearance of synovial fluid is advantageous as it provides an arthroscopic effect that "fills in" defects in articular cartilage, increasing the conspicuity of cartilage irregularities. Finally, a new sequence for imaging articular cartilage should require short scan times, adding little to the time required for a standard knee protocol.

Steady-state free precession (SSFP) is a rapid gradient echo imaging technique with renewed interest in recent years, owing to widespread availability of high speed gradient systems. SSFP has superior signal to noise ratio (SNR) compared with other gradient echo techniques and has excellent contrast behavior that has mixed dependence on T1 and T2. In particular, synovial fluid appears bright on SSFP images owing to its long T2. The major limitation of SSFP is severe image degradation caused by local magnetic field inhomogeneties if the repetition time (TR) is long.

BRIEF SUMMARY OF THE INVENTION

The present invention is directed to MRI using SSFP, for example, and with fat and water signal separation. More particularly, the invention achieves fat-water signal separation in the presence of magnetic field inhomogeniety.

In one application, multi-point fat and water signal separation is combined with three-dimensional steady-state free precession (3D SSFP) imaging for rapid imaging of articular cartilage. A mathematical process provides a field map which can account for a resonance offset due to magnetic field inhomogeniety. Multiple point sampling at different echo time (TE) increments provides signals which can be combined using a linear least squares approach to estimate water and fat images. The invention allows the use of small echo time (TE) increments that may be helpful with SSFP but also with other imaging methods as well.

The invention and objects and features thereof will be more readily apparent from owing detailed description and appended claims when taken with the drawings.

DETAILED DESCRIPTION OF THE INVENTION

The invention will be described with reference to a generalized mathematical formulation for multi-echo fat-water separation that allows the use of small increments in echo time (TE) in three dimensional (3D) SSFP imaging of articular cartilage in the knees of normal volunteers. Three dimensional spoiled gradient echo images with fat-saturation are shown for comparison.

SSFP and Fat-Water Separation

Separation of fat and water through "in-phase" and "out-of-phase" imaging is an effective approach first demonstrated by Dixon, "*Simple Proton Spectroscopic Imaging,*"

Figure 1:
FIGS. 1A and 1B illustrate sagittal images through the knee using SSFP with an echo time of 1.16 ms and repetition times of 6.1 ms and 6.6 ms, respectively.
Figure 1:

Radiology 1984; 153: 189–194, and further refined by Glover, "*Multipoint Dixon Technique for Water and Fat Proton and Susceptability Imaging*," Journal of Magnetic Resonance Imaging 1991; 1:521–530, to compensate for the effects of magnetic field inhomogeneities. Typical three-point sampling schemes acquire spin-echo or gradient echo images with echo time (TE) increments of 0, 2.27, and 4.45 ms, and produce phase increments of 0, $\pi$, and $2\pi$, when the frequency difference between fat and water is approximately −220 Hz at 1.51. These values of TE lengthen the minimum TR and would cause severe image degradation with SSFP imaging, in the presence of typical magnetic field inhomogeneities. FIGS. 1A and 1B show two sagittal SSFP images of a knee at two values of TR. The image acquired with a TR of 6.6 ms exhibits substantial signal dropout throughout the bone marrow of the tibia and femur. Reducing TR to 6.1 ms is sufficient to substantially reduce signal dropout in the bone marrow.

In accordance with the invention, a generalized formulation for fat-water separation allows increments in TE to be less than those used in standard three-point techniques. The signal from a voxel comprised of water ($\rho_w$) and fat ($\rho_f$), acquired at echo time $t_n$ in the presence of a resonance offset due to field inhomogeneity, $\Psi$(Hz), can be written, $$s_n = (\rho_w + \rho_F e^{i2\pi \Delta f t_n}) e^{i2\rho \Psi t_n} \quad (1)$$

where $\Delta f$ is the difference in resonance frequency between fat and water (Hz). If N images, $S_n$, are acquired with echo times $t_n$, then an estimate of the water and fat images can be made using the linear least squares approach described as follows, if an estimate of the resonance offset, $\Psi$, is known.

If N images $s_n$(n=1, . . . , N) are acquired at times $t_n$, and normalized for the field inhomogeneity phasor, $e^{i2\pi \Psi t_n}$, then equation 1 can be rewritten in matrix form, $$S' = A\rho \quad (1A)$$

where $S' = [s_1 e^{-i2\pi \Psi t_1} \, s_N e^{-i2\pi \Psi t^2} \cdots s_N e^{-i2\pi \Psi t^N}]^T$ is the image vector, $\rho = [\rho_w, \rho_f])$ and $$A = \begin{bmatrix} 1 & e^{i2\pi \Delta f t_1} \\ 1 & e^{i2\pi \Delta f t_2} \\ \cdots & \cdots \\ 1 & e^{i2\pi \Delta f t_N} \end{bmatrix}. \quad (2)$$

Using well described least-squares fitting approaches for linear systems of equations, it can be shown that the least squares estimate of water and fat is, $$\hat{\rho} = (A^{T^*} A)^{-1} A^{T^*} S^t \quad (3)$$

where T* denotes the complex transpose operation.

Although images acquired at any echo time $t_n$ can be used, optimal sampling to maximize SNR performance occurs when points are evenly spaced with TE increments of $1/(N\Delta f)$. This increment ensures uniform phase sampling of the fat-water phase shift at intervals of $2\pi/N$. For example, the optimum sampling at 1.5 T for a three-point technique occurs when the increments in TE are 0, 1.52, and 3.03 ms, leading to fat-water phase difference at 0, $2\pi/3$, and $4\pi/3$, respectively, but not an integer multiple of 180 degrees. Typical three-point schemes often use echo time increments of 0, 2.27, and 4.54 ms to achieve sampling at 0, $\pi$, or, and $2\pi$, because the mathematics for this special case are greatly simplified and post-processing calculations are faster.

Off-Resonance Map Estimation and Sorting

There are several methods available to determine the off-resonance map, $\Psi$, including a standard three-point technique and a modified two-point technique. However, these methods are not suited for short echo time increments. A convenient three-point method suitable for short echo time increments has been described by Xiang and An, "*Water-Fat Imaging with Direct Phase Encoding*," Journal of Magnetic Resonance Imaging 1997; 7:1002–1015, but only determines solutions for $\rho_w$ and $\rho_f$.

The work of Xiang and An is based on the acquisition of three images $s_1$, $s_2$ and $S_3$ acquired at echo times $t_1$, $t_2$, and $t_3$ equally spaced by $\Delta t$. It can be shown that the frequency offset (Hz) can be determined as, $$\Psi_\pm = \frac{\arg\left(\frac{2s_3}{s_2(1 + e^{i2\pi \Delta f \Delta t}) \pm \Delta s(1 - e^{i2\pi \Delta f \Delta t})}\right)}{2\pi \Delta t} \quad (4A)$$

where, $$\Delta s = \frac{\sqrt{(1 + e^{i2\pi \Delta f \Delta t})^2 s_2^2 - 4 e^{i2\pi \Delta f \Delta t} s_1 s_3}}{e^{i2\pi \Delta f \Delta t} - 1}. \quad (4B)$$

The natural ambiguity between assignment of a pixel as fat or water is explicitly borne out in the two solutions of $\Psi$.

To determine the correct assignment of the two solutions, the local orientation filter calculates two "orientation vectors", $O_+$ and $O_-$.

$$O_\pm = \frac{1}{2}(s_2(1 + e^{-i2\pi \Delta f t_2}) \pm \Delta s(1 - e^{-i2\pi \Delta f t_2})) \quad (5)$$

for each pixel, see Xiang and An, supra. The phase of $O_\pm$ is equal to $2\pi \Psi_\pm t_2$. Assuming that the off-resonance map varies smoothly, the local orientation filter compares the phase of two solutions of $O_\pm$ for each pixel, with a local average, <O>, to determine the correct assignment of $\Psi_+$ or $\Psi_-$. Assignment is determined by calculating the vector dot products $O_+$*<O> and $O_+$*<O>. The larger of the two dot products indicates the closest phase alignment with the local average. If $O_+$*<o>>>o_*<O>, then $\Psi_+$ is chosen, and vice versa. The details of this calculation are described by Xiang and An, supra.

In regions containing only fat or only water, the two solutions reflect the natural ambiguity that results from the fact that the on-resonance water is indistinguishable from fat that is off-resonance by +220 Hz. Practically, this causes abrupt transitions in the calculated off-resonance map that manifests as incorrect assignment of some pixels from the water image to the fat image and vice versa when inserted into equation 5. We have found that the "local orientation filter" described by Xiang and An is an effective means for filtering the two solutions of the off-resonance map, removing fat-water assignment ambiguities. Like most phase sorting algorithms, the local orientation filter is based on the supposition that the off-resonance map varies slowly with position, which is generally a good assumption. Insertion of the two filtered solutions of $\Psi$ into equation 3A yields both the water image and fat image.

Optimal SSFP Tip Angle

The tip angle that maximizes the signal of an SSFP image for a material with a given T1, T2 and TR is known, as follows:

$$\alpha = \cos^{-1}\left(\frac{e^{-\frac{TR}{T_1}} - e^{-\frac{TR}{T_2}}}{1 - e^{-\frac{TR}{T_1}} e^{-\frac{TR}{T_2}}}\right) \quad (6)$$

when the phase of the subsequent radio-frequency pulses is alternated between 0° and 180°. Similar in principle to the Ernst angle, which is used to optimize the tip angle for spoiled gradient echo sequences, equation 2 can be used to optimize tip angles for SSFP imaging.

Human Subjects

A 1.5 T GE Signa scanner (40 mT/m maximum gradient strength, 150 mT/m/ms slew rate, GE Medical Systems, Milwaukee, Wis.) was used to acquire sagittal and axial images of ten knees from five healthy volunteers (age range 28–39, 3 men, 2 women) using a product extremity coil. The left knee of one volunteer had had a previous anterior cruciate ligament repair with titanium orthopedic fixation devices in the distal femur and proximal tibia.

Pulse Sequences

A three dimensional SSFP imaging sequence was used with the following imaging parameters: $N_x$=256, $N_y$=92, $N_z$=64, field of view=16 cm, and slice thickness=1.5 mm for voxel dimensions of 0.63×0.83×1.5 mm³. Other parameters included: number of signal averages (NSA)=1, bandwidth=±125 kHz, TR=6.14 ms and TE=1.16, 2.08, 3.00, and 3.92 ms. A fractional echo was used to reduce TR and the minimum TE. Separate sequential scans were performed for each TE, and total scan time for all four echoes was 5:02 minutes. Linear auto-shimming was used. Using equation 6, the tip angle was chosen to be 27°, based on published relaxation properties of hyaline cartilage (T1=674 ms, T2=40), and TR=6.14 ms.

For comparison, three dimensional spoiled gradient echo images with fat-saturation were acquired at the same slice locations and same image resolution as the SSFP images. For this sequence TR=50 ms, TE=5 ms (full echo), tip angle=40°, and bandwidth was decreased to ±16 kHz. These parameters are based on established reports using fat-saturated spoiled gradient echo imaging of articular cartilage. Total spoiled gradient echo imaging time for a complete set of sagittal images was 12:04 minutes for one knee.

Image Reconstruction

An off-line reconstruction program written in Matlab 6.0 (Mathworks, Mountain View, Calif.) was used to perform fast Fourier transform reconstruction of all images. Following reconstruction of complex (magnitude and phase) images, calculation of SSFP water and fat images was performed based on equation 3, after sorting the calculated off-resonance maps using a search algorithm that incorporated the local orientation filter discussed above.

Signal to Noise Measurements

Measurements of SNR from articular cartilage were used to calculate SNR efficiency, which we define as, $\eta = SNR^2/T$, where T is the total scan time of the acquisition. This metric allows equal comparison of SNR performance of pulse sequences with different acquisition times. With this definition, the SNR efficiency of SSFP relative to spoiled gradient echo imaging can be compared through the ratio of $\eta$ for SSFP and spoiled gradient echo imaging, $$\frac{\eta_{SSFP}}{\eta_{SPGR}} = \left(\frac{SNR_{SSFP}}{SNR_{SPGR}}\right)^2 \left(\frac{T_{SPGR}}{T_{SSFP}}\right). \quad (7)$$

For both SSFP and spoiled gradient echo imaging acquisitions, cartilage SNR was measured from sagittal images through the lateral femoral condyle from all knees, and the ratio of SNR efficiency was calculated from equation 3.

Figure 2:
FIGS. 2A–2D illustrate sagittal images through the labrial femoral condyle using measured SSFP images, calculated SSFP water image, calculated SSFP fat image, and a fat-saturated spoiled gradient echo image, respectively.
Figure 2:
Figure 2:
Figure 2:
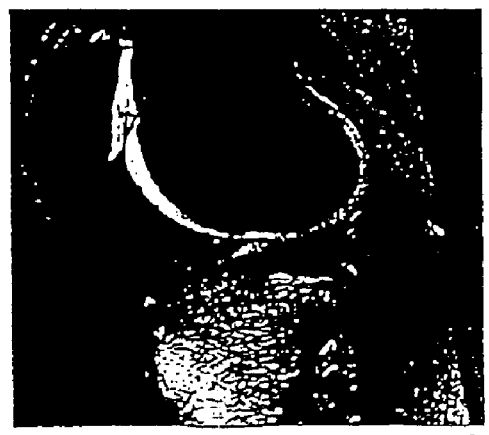

FIGS. 2A–D show multiple sagittal images from one subject through the lateral femoral condyle of the right knee. FIG. 2A is an average of the magnitude of the SSFP source images, followed by water (FIG. 2B) and fat (FIG. 2C) images calculated from equation 3, using the four source SSFP images acquired at the four echo times, and estimates of the off-resonance map calculated with the modified local orientation filter. Excellent fat separation and visualization of the cartilage is seen, and synovial fluid appears very bright. FIG. 2D shows the fat-saturated spoiled gradient echo image through the same slice and also shows excellent visualization of articular cartilage, although fat-saturation is non-uniform, and synovial fluid has intermediate to low signal making it difficult to visualize.

Cartilage SNR measurements from both SSFP and spoiled gradient echo images are listed in table 1.

TABLE 1

SNR measured from sagittal SSFP water images and fat-saturated spoiled gradient echo (SPGR) images, through the cartilage of the lateral femoral condyle in ten knees from five volunteers.

| Volunteer | Knee | SNR (SSFP) | SNR (SPGR) | $\eta_{SSFP}/\eta_{SPGR}$ |
|---|---|---|---|---|
| 1 | R | 14.8 | 12.7 | 3.3 |
|  | L | 13.4 | 14.1 | 2.2 |
| 2 | R | 8.2 | 8.4 | 2.3 |
|  | L | 8.5 | 8.8 | 2.2 |
| 3 | R | 19.9 | 16.2 | 3.6 |
|  | L | 16.7 | 15.8 | 2.7 |
| 4 | R | 16.5 | 18.5 | 1.9 |
|  | L | 14.2 | 15.8 | 1.9 |
| 5 | R | 16.2 | 16.8 | 2.2 |
|  | L | 17.0 | 18.1 | 2.1 |
|  | Mean | 14.5 | 14.5 | 2.4 |
|  | Std. Dev. | 3.7 | 3.6 | 0.6 |

An average SNR of 14.5±3.7 (mean±standard deviation) was measured in the cartilage from the SSFP water images and 14.5±3.6 from the spoiled gradient echo images. The ratio of the SNR efficiencies for each set of measurements is given in the right column of table 1. The expected ratio of efficiencies would be one if the SNR performance per unit scan time of both pulse sequences were equivalent. Using this as a null hypothesis, a two sided paired t-test comparing the calculated ratio to the expected ratio of one, shows that the SNR efficiency of SSFP for imaging articular cartilage is significantly higher than spoiled gradient echo imaging (p<0.001). The average efficiency ratio of 2.4±0.6 implies that SSFP requires only 1/2.4=42% as much acquisition time as spoiled gradient echo imaging to produce images with comparable SNR.

Figure 3:
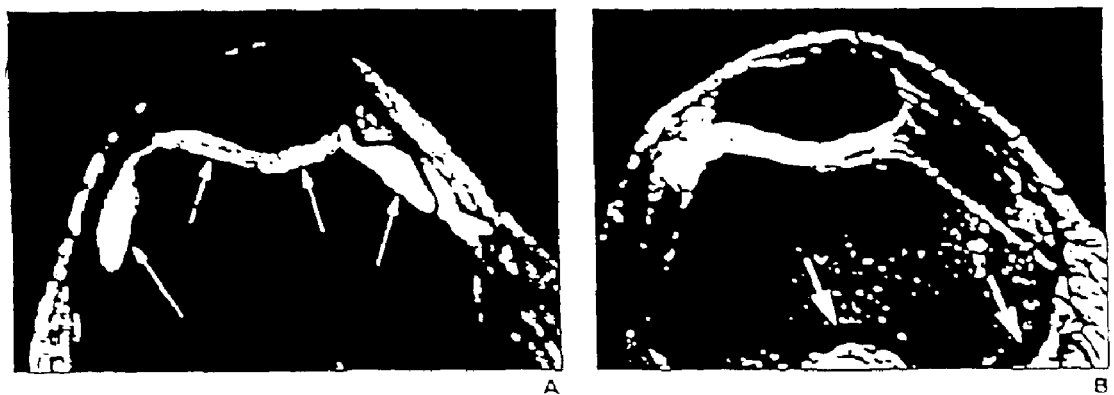
FIGS. 3A and 3B illustrate an axial SSFP water image and a corresponding fat-saturated spoiled gradient echo image, respectively.

FIG. 3A shows an axial SSFP water image through the patella-femoral joint of one volunteer with known cartilage abnormalities. Also shown is a spoiled gradient echo image at the same location (FIG. 3B). Bright synovial fluid is seen in the SSFP image, intercalated between the femoral and patellar cartilage. Joint fluid in the spoiled gradient echo image has low to intermediate signal due to its long T1 and is less conspicuous than fluid in the SSFP image, where the long T2 of fluid results in high signal intensity. Chemical shift artifact is also seen in the spoiled gradient echo image at fat-water interfaces perpendicular to the readout direction (anterior-posterior).

Figure 4:
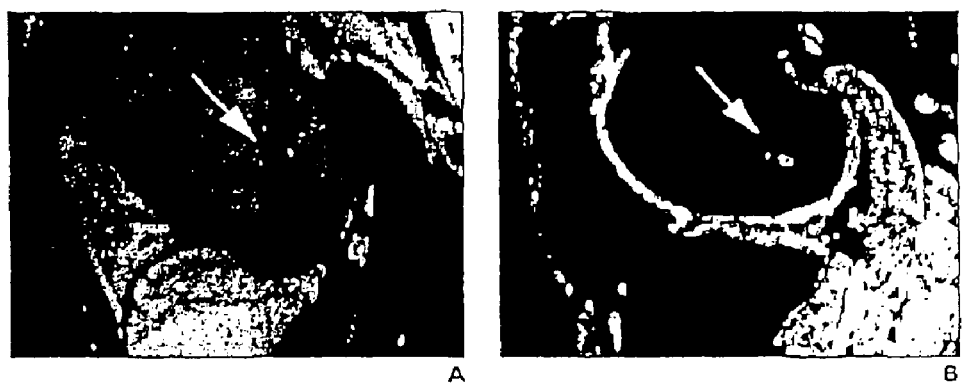
FIGS. 4A–4C illustrate sagittal images through a titanium anterior cruciate ligament fixation screw using an average of four magnitude source SSFP images, a spoiled gradient echo water image, and a spoiled gradient echo fat-saturated image, respectively.
Figure 4:
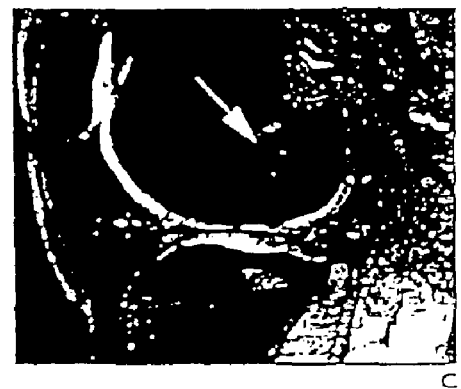
Figure 5A:
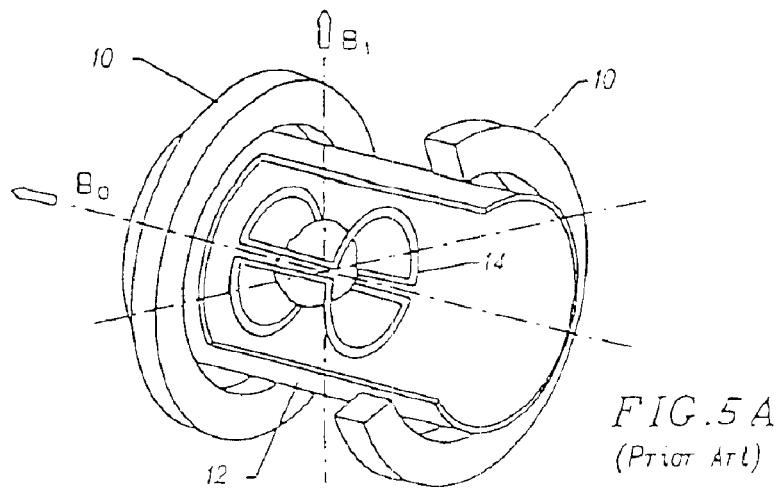
FIG. 5A is perspective view partially in section illustrating conventional coil apparatus in an NMR imaging system.
Figure 5B:
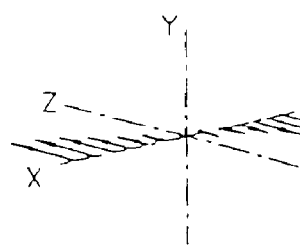
FIGS. 5B–5D illustrate field gradients which can be produced in the apparatus of FIG. 5A.
Figure 5C:
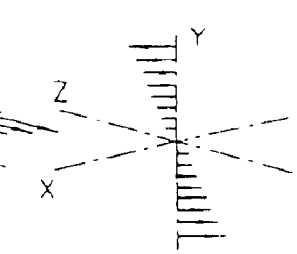
Figure 5D:
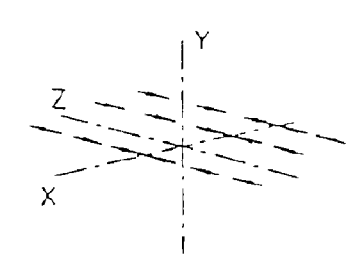
Figure 6:
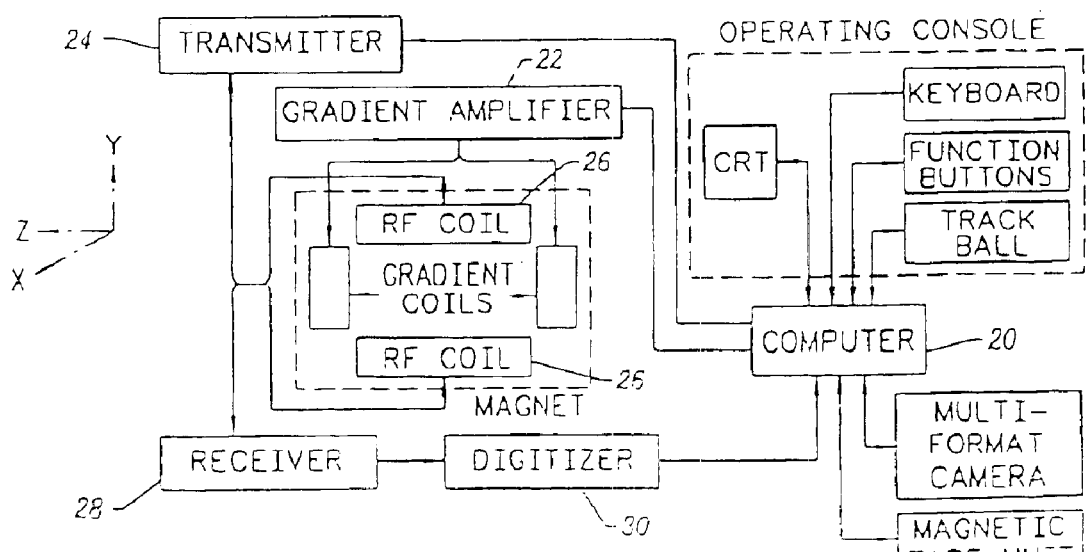
FIG. 6 is a functional block diagram of conventional imaging apparatus.

Metallic implants often cause susceptibility artifacts that result in areas of focal signal dropout and distortion. In the one knee with titanium fixation screws, both SSFP and spoiled gradient echo images showed comparable focal signal deficits in the vicinity of the fixation hardware, although the adjacent articular cartilage was largely unaffected. SSFP and spoiled gradient echo images through the fixation screw in the lateral femoral condyle are shown in FIGS. 4A–4C, respectively.

Excellent fat-water separation to improve articular cartilage consipcuity can be achieved with SSFP and multi-point fat-water separation methods that use generalized solutions permitting short increments in echo time. Unlike fat-saturation techniques, multi-point fat-water separation is relatively insensitive to field inhomogeneities. Not only does SSFP produce good cartilage signal, but joint fluid is very bright, which may provide an arthroscopic effect that outlines subtle defects of articular cartilage. Compared with 3D spoiled gradient echo imaging with fat-saturation, four-point fat-water separation combined with SSFP imaging of articular cartilage of the knee can reduce scan time by 58% with improved fat-water separation and comparable SNR performance.

Since signal intensities of SSFP and spoiled gradient echo have different dependence on relaxation times, the comparison of SNR and SNR efficiency depends on which tissue is used in the comparison. Cartilage is chosen for comparison because it generally has low SNR, making increases or decreases very noticeable. A logical alternative could involve contrast to noise ratio (CNR) between cartilage and synovial fluid. This comparison would greatly favor SSFP because the signal from fluid is much higher with SSFP.

Selection of tip angle for this study was based on maximizing cartilage signal based on known values of T1 and T2. Although optimization of tip angle to maximize contrast between synovial fluid and cartilage may be interesting, the contrast between synovial fluid and cartilage appeared adequate even with a 27° tip angle that was chosen to maximize cartilage signal.

Visualization of cartilage is markedly improved if the lipid signal from adjacent tissues can be suppressed. Known SSFP fat suppression techniques such as fluctuating equilibrium magnetic resonance and fat-saturation are effective but are relatively sensitive to magnetic field inhomogeneities. Excellent separation of fat and water with modified three-point fat-water separation techniques in combination with fast spin-echo techniques was applied previously to low field musculoskeletal imaging, and pediatric imaging. T2-weighted fast spin-echo images have bright synovial fluid that contrasts osteochondral defects. However, the inherent cartilage signal is low and fast spin-echo techniques are slow and often have limited resolution due to spatial blurring from T2 decay. Proton density fast spin-echo also suffers from spatial blurring and has poor cartilage/fluid contrast. Three dimensional spoiled gradient echo imaging with fat-saturation offers high resolution images but contrast between cartilage and synovial fluid contrast is suboptimal because of low spoiled gradient echo fluid signal.

SSFP is a rapid gradient echo technique that produces relatively high signal compared with other gradient echo techniques such as spoiled gradient echo imaging. Short repetition times are required to prevent signal dropout artifacts caused by local magnetic field inhomogeneities. A TR of about 6.1 ms provided a balance between signal dropout and the longest possible increments in TE to maximize SNR in the calculated water image. Optimal increments in TE to maximize the SNR of the water and fat images for a four-point scheme would be 0, 1.14, 2.27 and 3.41 ms. However, this increased the TR of the SSFP pulse sequence to 6.6 ms at which point signal dropout artifacts became significant. A compromise of 0, 0.92, 1.84, and 2.76 ms echo time increments was chosen yielding a TR of 6.14 ms with significantly fewer field inhomogeneity related artifacts and good SNR.

A bandwidth of ±125 kHz was required for SSFP to maintain a sufficiently short TR that prevented significant dephasing artifacts, compared with a bandwidth of ±16 kHz used for spoiled gradient echo imaging. One advantage of a high receiver bandwidth is the reduction of distortion artifact from areas of high susceptibility such as metallic implants, and a reduction of fat-water chemical shift displacement artifact. An important disadvantage of high bandwidth is the reduction in SNR of SSFP relative to spoiled gradient echo imaging by a factor of 2.8 (=$\sqrt{125/166}$).

In addition, the SSFP acquisition was shorter than the spoiled gradient echo acquisition by a factor of about 2.4, which reduces the relative SNR of SSFP by a factor of about 1.5 (=$\sqrt{\eta_{SSFP}/\eta_{SPGR}}=\sqrt{2.4}$). Despite the differences in scan time and bandwidth, the SNR of articular cartilage from both sequences was comparable, reflecting the inherently high SNR efficiency of SSFP. Here, the high SNR efficiency of SSFP was used to achieve shorter scan times. Alternatively, it could have been used to improve image resolution.

An additional advantage of SSFP fat-water separation is the availability of the initial source images, which can be averaged together, as well as the fat images and off-resonance maps that are available at little additional computational cost. Although the source images and fat images may have diagnostic value in addition to the water images, the off-resonance maps are less likely to contribute helpful information.

An inherent assumption of most phase sorting algorithms used for multi-point fat-water separation methods, is that the magnetic field inhomogeneities vary smoothly across the image. Transitions greater than 220 Hz between two adjacent pixels may present difficulty to unwrapping algorithms; fortunately, steep gradients such as these are seldom encountered. In addition, the smoothly varying nature of the field inhomogeneity has been exploited with other fat-water separation techniques to reduce imaging time through acquisition of low resolution images used to calculate off-resonance maps.

Figure 7:
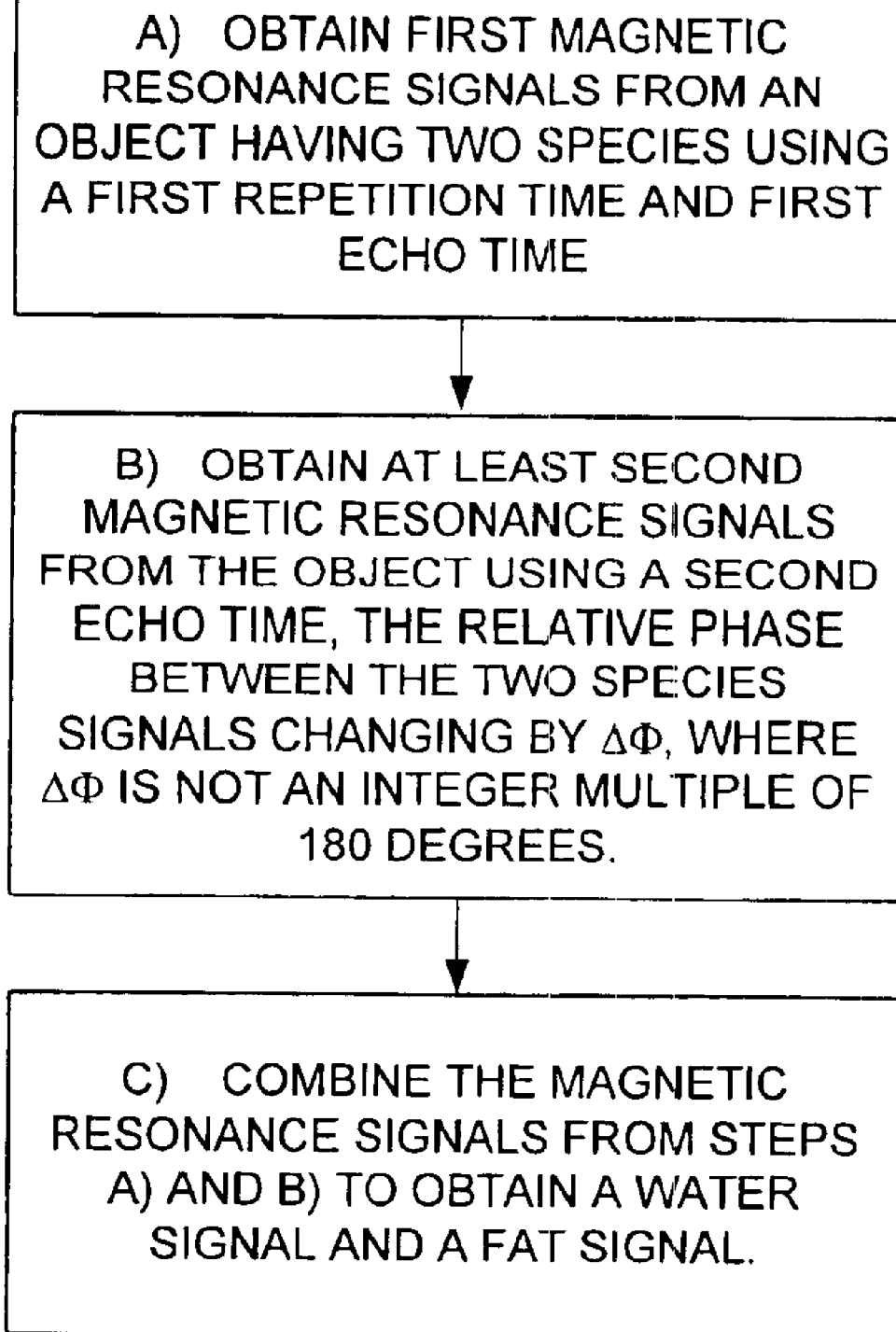
FIG. 7 is a flow diagram of signal processing in accordance with one embodiment of the invention.

In summary, 3D SSFP imaging combined with a generalized multi-point fat-water separation technique is a novel and effective method of producing high quality cartilage images with improved fat-water separation. In addition, synovial fluid appears bright, and SNR is comparable to 3D spoiled gradient echo fat-saturated images, despite a 58% reduction of total imaging time. FIG. 7 is a flow diagram of MRI signal processing in accordance with one embodiment of the invention described above.

While the invention has been described with reference to specific embodiments, the description is illustrative of the invention and is not to be construed as limiting the invention. For example, while the invention has been described above mostly in the context of SSFP imaging, it can be applied to any MR gradient echo imaging method that can collect images with controllable echo delays, or in any spin echo imaging method where the time of effective data acquisition can be adjusted to not necessarily be at the spin echo. Further, while the method has been described in the context of separating the measured signal into fat and water, it can be used more generally to separate the measured signal into two or more components, not just fat and water, as long as the components have different resonance frequencies. Various modifications and applications may occur to those skilled in the art without departing from the true spirit and scope of the invention as defined by the appended claims.

What is claimed is:

1. A method of obtaining magnetic resonance images with signal separation for two species comprising the steps of:

a) obtaining first magnetic resonance signals from an object having first and second species using a first repetition time and a first echo time, b) obtaining at least second magnetic resonance signals from the object using a second echo time, in a second sequence wherein tip angle, $\alpha$, for each magnetic resonance sequence is given by:

$$\alpha = \cos^{-1}\left(\frac{e^{-\frac{TR}{T_1}} - e^{-\frac{TR}{T_2}}}{1 - e^{-\frac{TR}{T_1}} e^{-\frac{TR}{T_2}}}\right)$$

where T1, T2 are relaxation times of material in the object and TR is the sequence repetition time, and c) combining the magnetic resonance signals from steps a) and b) to obtain a first species signal and a second species signal which match said magnetic resonance signals in a least squares sense.

2. A method of obtaining magnetic resonance images with signal separation for two species comprising the steps of:

a) obtaining first magnetic resonance signals from an object having first and second species using a first repetition time and a first echo time, b) obtaining at least second magnetic resonance signals from the object using a second echo time, wherein the relative phase between the two species signals changes by $\Delta\phi$, when $\Delta\phi$ is not an integer multiple of 180 degrees, and c) combining the magnetic resonance signals from steps a) and b) to obtain a first species signal and a second species signal which match said magnetic resonance signals in a least squares sense.

3. The method as defined by claim 2 wherein step b) includes obtaining third magnetic resonance signals from the object using a third echo time different from the first echo time and the second echo time.

4. The method as defined by claim 3 wherein the echo signals are obtained in a magnetic resonance system with a magnetic field inhomogeniety, $\Psi$(Hz).

5. The method as defined by claim 4 wherein the two species are water and fat and a signal from a voxel comprised of water ($\rho_w$) and fat ($\rho_f$) acquired at echo time $t_n$ is:

$$S_n = (\rho_F e^{i2\rho\Delta f t_2}) e^{i2\rho\Psi t^2}$$

where $\Delta f$ is the difference in resonance frequency between fat and water (Hz).

6. The method as defined by claim 5 where N images, $S_n$, are acquired with echo times $t_n$, and water and fat images are estimated using a linear least squares determination.

7. The method as defined by claim 5 wherein tip angle, $\alpha$, for each magnetic resonance sequence is given by:

$$\alpha = \cos^{-1}\left(\frac{e^{-\frac{TR}{T_1}} - e^{-\frac{TR}{T_2}}}{1 - e^{-\frac{TR}{T_1}} e^{-\frac{TR}{T_2}}}\right)$$

where T1, T2 are relaxation times of material in the object and TR is the sequence repetition time.

8. The method as defined by claim 2 wherein in steps a) and b) SSFP signals are obtained.

9. In a magnetic resonance imaging system, a processor which is programmed to:

a) obtain first magnetic resonance signals from an object having two species using a first repetition time and a first echo time, b) obtain at least second magnetic resonance signals from the object using a second echo time, wherein the relative phase between the two species signals changes by $\Delta\phi$, when $\Delta\phi$ is not an integer multiple of 180 degrees, and c) combine the magnetic resonance signals from steps a) and b) to obtain a water signal and a fat signal.

10. The processor as defined by claim 9 wherein step b) includes obtaining third magnetic resonance signals from the object using a third echo time different from the first echo time and the second echo time.

11. A method of obtaining magnetic resonance images with signal separation for two species comprising the steps of:

a) obtaining first magnetic resonance signals from an object having first and second species using a first repetition time and a first echo time, b) obtaining at least second magnetic resonance signals from the object using a second echo time, wherein the relative phase between the two species signals changes by $\Delta\phi$, when $\Delta\phi$ is not an integer multiple of 180 degrees, c) combining the magnetic resonance signals from steps a) and b) to derive a magnetic field map, and d) using the signals from steps a) and b) and the magnetic field map from step c) to obtain a fat signal or a water signal.

12. The method as defined by claim 11 wherein step b) includes obtaining third magnetic resonance signals from the object using a third echo time different from the first echo time and the second echo time.

13. The method as defined by claim 12 wherein the echo signals are obtained in a magnetic resonance system with a magnetic field inhomogeniety, $\Psi$(Hz).

14. The method as defined by claim 13 wherein the two species are water and fat and a signal from a voxel comprised of water ($\rho_w$) and fat ($\rho_f$) acquired at echo time $t_n$ is:

$$S_n = (\rho_w + \rho_F e^{i2\pi\Delta f t_2}) e^{i2\pi\Psi t_2}$$

where $\Delta f$ is the difference in resonance frequency between fat and water (Hz).

15. The method as defined by claim 14 where N images, $S_n$, are acquired with echo times to, and water and fat images are estimated using a linear least squares determination.

16. The method as defined by claim 15 wherein tip angle, $\alpha$, for each magnetic resonance sequence is given by:

$$\alpha = \cos^{-1}\left(\frac{e^{-\frac{TR}{T_1}} - e^{-\frac{TR}{T_2}}}{1 - e^{-\frac{TR}{T_1}} e^{-\frac{TR}{T_2}}}\right)$$

where T1, T2 are relaxation times of material in the object and TR is the sequence repetition time.

17. The method as defined by claim 11 wherein tip angle, $\alpha$, for each magnetic resonance sequence is given by:

$$\alpha = \cos^{-1}\left(\frac{e^{-\frac{TR}{T_1}} - e^{-\frac{TR}{T_2}}}{1 - e^{-\frac{TR}{T_1}} e^{-\frac{TR}{T_2}}}\right)$$

where T1, T2 are relaxation times of material in the object and TR is the sequence repetition time.

18. The method as defined by claim 11 wherein in steps a) and b) SSFP signals are obtained.

* * * * *